US009123442B2

(12) United States Patent
Li et al.

(10) Patent No.: US 9,123,442 B2
(45) Date of Patent: Sep. 1, 2015

(54) TESTING DEVICE

(75) Inventors: Quan Li, New Taipei (TW); Kuan-Han Chen, New Taipei (TW); Yin-Ching Wu, New Taipei (TW)

(73) Assignee: Wistron Corporation, New Taipei (TW)

( * ) Notice: Subject to any disclaimer, the term of this patent is extended or adjusted under 35 U.S.C. 154(b) by 263 days.

(21) Appl. No.: 13/609,260

(22) Filed: Sep. 11, 2012

(65) Prior Publication Data

US 2014/0009179 A1    Jan. 9, 2014

(30) Foreign Application Priority Data

Jul. 4, 2012    (CN) .......................... 2012 1 0230545

(51) Int. Cl.
*G01R 31/00* (2006.01)
*G11C 29/02* (2006.01)
*G06F 11/22* (2006.01)
*G11C 29/56* (2006.01)

(52) U.S. Cl.
CPC .......... *G11C 29/022* (2013.01); *G06F 11/2221* (2013.01); *G11C 2029/5602* (2013.01)

(58) Field of Classification Search
CPC ........................... G11C 29/022; G06F 11/221
USPC .................... 324/750.01, 538–542
See application file for complete search history.

(56) References Cited

U.S. PATENT DOCUMENTS

| | | | | |
|---|---|---|---|---|
| 5,257,393 | A * | 10/1993 | Miller ........................... | 709/224 |
| 6,772,380 | B1 * | 8/2004 | Ali et al. ........................ | 714/724 |
| 7,246,257 | B2 * | 7/2007 | Lai et al. ......................... | 714/6.2 |
| 7,454,586 | B2 | 11/2008 | Shi et al. | |
| 2004/0034812 | A1 * | 2/2004 | Halphide et al. ................ | 714/25 |
| 2006/0046562 | A1 * | 3/2006 | Ou Yang et al. ........... | 439/541.5 |
| 2008/0294943 | A1 * | 11/2008 | Hsieh et al. ..................... | 714/42 |
| 2012/0166885 | A1 * | 6/2012 | Zhan ............................... | 714/42 |
| 2013/0043883 | A1 * | 2/2013 | Li et al. .......................... | 324/600 |

FOREIGN PATENT DOCUMENTS

| | | |
|---|---|---|
| TW | 200415459 | 8/2004 |
| TW | 200703007 | 1/2007 |
| TW | 201027088 | 7/2010 |

OTHER PUBLICATIONS

"Office Action of Taiwan Counterpart Application", issued on Jan. 21, 2014, p. 1-p. 7.

* cited by examiner

*Primary Examiner* — Patrick Assouad
*Assistant Examiner* — Demetrius Pretlow
(74) *Attorney, Agent, or Firm* — Jianq Chyun IP Office

(57) ABSTRACT

A testing device including a first connector, a control unit, a first detecting circuit and a memory controller is provided. The first connector is electrically connected to a first bus. The control unit generates a plurality of first control signals according to a first enable signal from the first connector. The first detecting circuit is electrically connected to a plurality of first transmission lines in the first bus, and sequentially conducts the first transmission lines to a ground according to the first control signals. The memory controller detects states of the signals transmitted by the first transmission lines and determines whether to generate a first abnormal indication signal according to a detecting result. The control unit controls a plurality of indication lights according to the first abnormal indication signal.

15 Claims, 3 Drawing Sheets

TESTING DEVICE

CROSS-REFERENCE TO RELATED APPLICATION

This application claims the priority benefit of China application serial no. 201210230545.2, filed on Jul. 4, 2012. The entirety of the above-mentioned patent application is hereby incorporated by reference herein and made a part of this specification.

BACKGROUND OF THE DISCLOSURE

1. Field of the Disclosure

The disclosure relates to a testing device and more particularly relates to a testing device for testing a main board.

2. Description of Related Art

Generally speaking, a main board that is to be used in a computer or server system needs to be tested and verified by an in-circuit tester (ICT) or an automatic test equipment (ATE) to determine if the main board can function properly.

However, in consideration of the cost and restriction on the test of pin structures, the current ICT and ATE are not applicable to the testing of dual in-line package (DIP) devices, such as serial attached SCSI (SAS) connectors and serial advanced technology attachment (SATA) connectors. Currently main boards are mostly connected to an external hard disk via a SAS connector or a SATA connector. That is, at present, manufacturers in this field cannot test open circuit or short circuit of SAS connectors, SATA connectors, and the related wirings through ICT or ATE. As a result, the interface signals of hard disks cannot be verified, and it becomes a loophole in the testing of main boards.

SUMMARY OF THE DISCLOSURE

The disclosure provides a testing device, which is adapted for testing the soldering of a SAS connector or SATA connector and the conduction of the related wirings on a main board and serves as a solid state disk.

The disclosure provides a testing device, including a first connector, a control unit, a first detecting circuit, and a memory controller. The first connector is electrically connected to a first bus. The control unit generates a plurality of first control signals according to a first enable signal from the first connector. The first detecting circuit is electrically connected to a plurality of first transmission lines in the first bus, and sequentially conducts the first transmission lines to a ground according to the first control signals. The memory controller detects states of the signals transmitted by the first transmission lines and determines whether to generate a first abnormal indication signal according to a detecting result. Herein, the control unit controls a plurality of indication lights according to the first abnormal indication signal.

In an embodiment of the disclosure, the testing device further includes a plurality of memories. Herein, the memories are electrically connected to the memory controller, and the memory controller accesses the memories according to an interface signal transmitted by the first bus.

In an embodiment of the disclosure, the first connector further includes a plurality of first power pins. The first detecting circuit respectively divides signals from the first power pins and generates a plurality of first divided signals accordingly. In addition, the control unit compares the first divided signals with a first reference voltage and controls the indication lights based on a comparison result.

In an embodiment of the disclosure, the first connector further includes a plurality of first ground pins. The first detecting circuit detects signals from the first ground pins and generates a plurality of first detecting signals accordingly. In addition, the control unit compares the first detecting signals with a second reference voltage and controls the indication lights based on a comparison result.

In an embodiment of the disclosure, the testing device further includes a second connector, a second detecting circuit, and a bridge. The second connector is electrically connected to a second bus, and the control unit generates a plurality of second control signals according to a second enable signal from the second connector. The second detecting circuit is electrically connected to a plurality of second transmission lines in the second bus, and sequentially conducts the second transmission lines to a ground according to the second control signals. The bridge is electrically connected to the second bus and detects states of the signals transmitted by the second transmission lines to determine whether to generate a second abnormal indication signal according to a detecting result. Herein, the control unit controls the indication lights according to the second abnormal indication signal.

Based on the above, the testing device of the disclosure is connected to a main board via a connector and tests signals from the connector to determine if the signals of the main board are abnormal. Accordingly, the soldering of a connector (for example, SATA connector, SAS connector) and the conduction of the related wirings on the main board can be tested. Moreover, the testing device of the disclosure is used as a solid state disk. That is, the testing device of the disclosure not only tests the interface signals of the hard disk but also helps reduce the production cost of the system.

To make the aforementioned and other features and advantages of the disclosure more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the disclosure.

DESCRIPTION OF THE EMBODIMENTS

Figure 1:
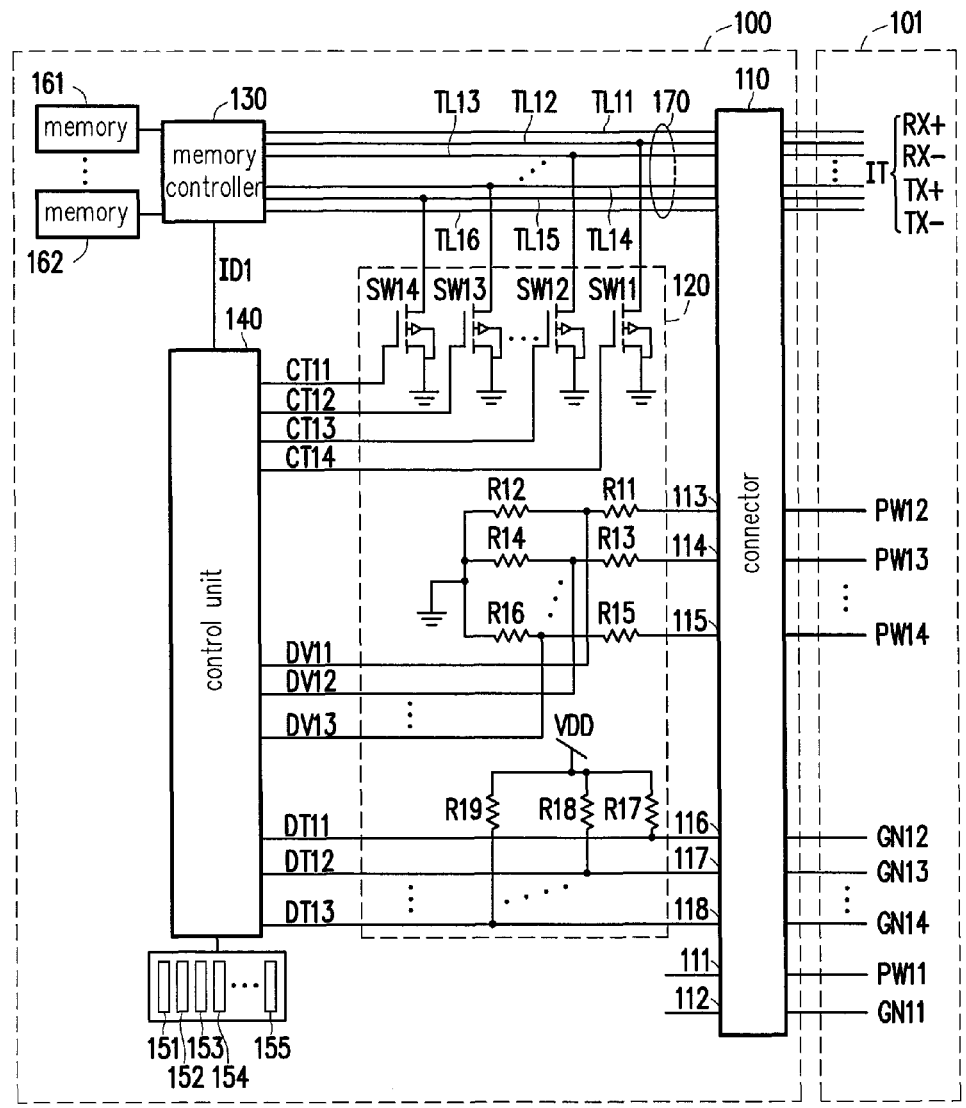
FIG. 1 is a schematic view of a testing device according to the first embodiment of the disclosure.

FIG. 1 is a schematic view of a testing device according to the first embodiment of the disclosure. Referring to FIG. 1, a testing device 100 includes a connector 110, a detecting circuit 120, a memory controller 130, a control unit 140, a plurality of indication lights 151-155, and a plurality of memories 161-162. Herein, the control unit 140 may be achieved by using a complex programmable logic device.

As shown in FIG. 1, the testing device 100 is electrically connected to a main board 101 via the connector 110, so as to perform a test on the main board 101. In the first embodiment, the connector 110 of the testing device 100 conforms to a first protocol, which is Serial Advanced Technology Attachment (SATA) protocol, for example. In other words, the connector 110 is a SATA connector, for example. Therefore, in the first embodiment, the testing device 100 is for example electrically connected to a SATA connector on the main board 101 via the connector 110, so as to test the open circuit or short circuit of the SATA connector and the related wirings both on the main board 101.

To make the disclosure easily understandable, FIG. 1 merely illustrates an interface signal IT transmitted by the SATA connector in the main board 101, a plurality of power signals PW11-PW14, and a plurality of ground signals GN11-GN14, wherein the interface signal IT includes a differential receiving signal (RX+,RX−) and a differential output signal (TX+,TX−).

Please continue referring to FIG. 1. The connector 110 is electrically connected to an end of a bus 170, and the memory controller 130 is electrically connected to the other end of the bus 170 and the memories 161-162. In addition, the detecting circuit 120 electrically connects the bus 170 and the control unit 140, and the control unit 140 electrically connects the memory controller 130, the detecting circuit 120, and the indication lights 151-155. In the first embodiment, the bus 170 conforms to the SATA protocol. That is, the bus 170 is a SATA bus, for example, and is used to transmit the interface signal IT from the main board 101. Moreover, the bus 170 includes a plurality of transmission lines TL11-TL16, wherein the transmission lines TL12-TL15 are used for transmitting the differential receiving signal (RX+,RX−) and the differential output signal (TX+,TX−) in the interface signal IT.

In terms of operation, when the testing device 100 is connected to the main board 101 via the connector 110, a power pin 111 in the connector 110 receives the power signal PW11 from the main board 101. In addition, the testing device 100 uses the power signal PW11 to generate an operating voltage required by the internal elements thereof, so as to drive the internal elements, such as the memory controller 130, the control unit 140, etc. Moreover, a ground pin 112 of the connector 110 receives the ground signal GN11 from the main board 101, and the testing device 100 transmits the ground signal GN11 to the control unit 140. When the control unit 140 receives the ground signal GN11, the control unit 140 regards the ground signal GN11 as an enable signal and begins testing the main board 101. In terms of testing, the testing device 100 sequentially tests the differential receiving signal (RX+,RX−) and the differential output signal (TX+, TX−) transmitted by the bus 170, so as to determine the soldering of the SATA connector and the conduction of the related wirings on the main board 101.

Figure 2:
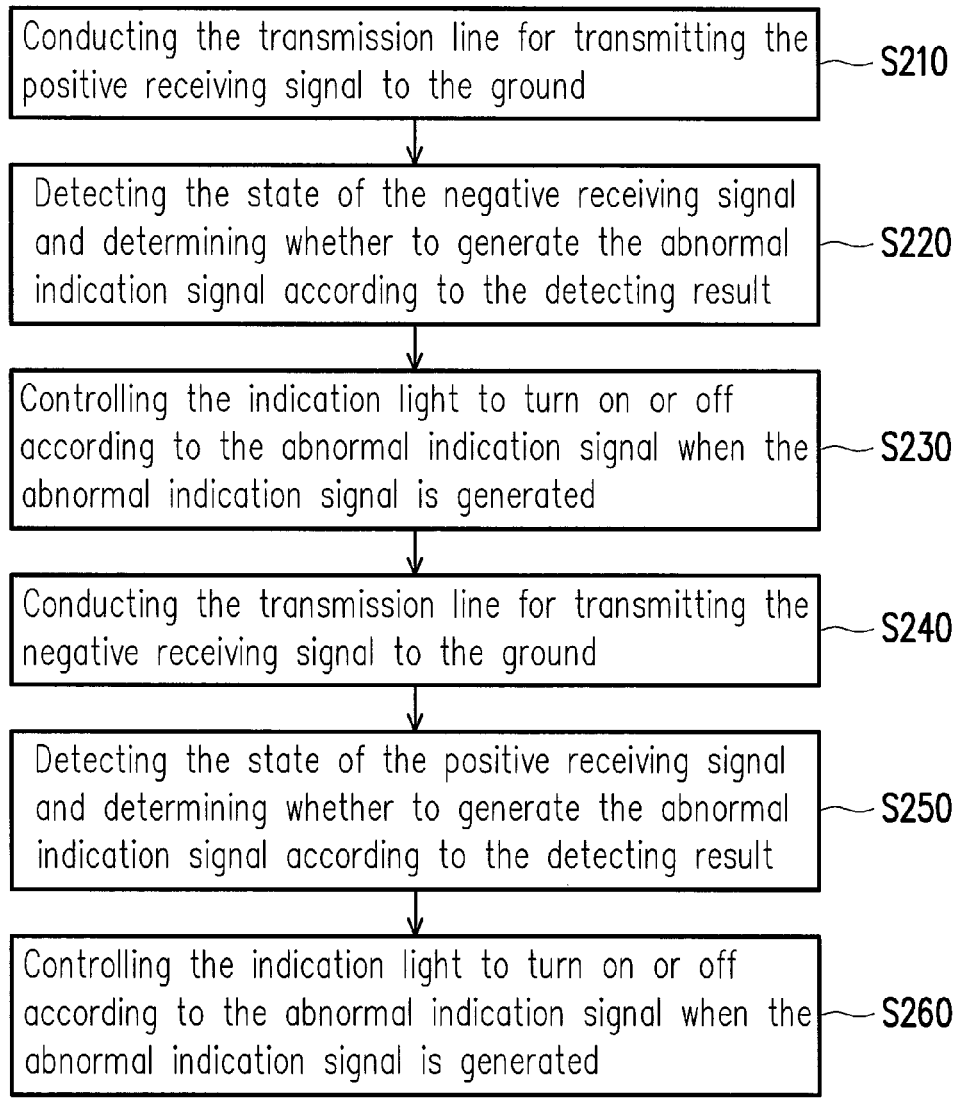
FIG. 2 is a flowchart illustrating a process for testing a differential receiving signal according to the first embodiment of the disclosure.

For instance, FIG. 2 is a flowchart illustrating a process of testing the differential receiving signal according to the first embodiment of the disclosure. Please refer to both FIG. 1 and FIG. 2. Given that the transmission lines TL12 and TL13 of the bus 170 are respectively used for transmitting a positive receiving signal RX+ and a negative receiving signal RX− of the differential receiving signal, in testing, the control unit 140 generates control signals CT11-CT14 to enable the detecting circuit 120 to conduct the transmission line TL12, which is for transmitting the positive receiving signal RX+, to a ground, as shown in Step S210. Next, as shown in Step S220, the memory controller 130 detects the state of the negative receiving signal RX− transmitted by the transmission line TL13 and determines whether to generate an abnormal indication signal ID1 according to the detecting result. In addition, as shown in Step S230, when the abnormal indication signal ID1 is generated, the control unit 140 controls the indication lights 151-155 according to the abnormal indication signal ID1.

For example, if the detecting result shows that the state of the negative receiving signal RX− is abnormal, open or short circuit may have occurred on the RX− pin of the SATA connector and the related wirings on the main board 101. Accordingly, the memory controller 130 generates the corresponding abnormal indication signal ID1, and the control unit 140 turns on the indication light, such as indication light 151, corresponding to the negative receiving signal RX− according to the abnormal indication signal ID1. However, if the detecting result shows that the state of the negative receiving signal RX− is normal, the memory controller 130 does not generate the corresponding abnormal indication signal ID1, and consequently the indication light corresponding to the negative receiving signal RX− is not turned on.

After detecting the state of the negative receiving signal RX−, as shown in Step S240, the control unit 140 uses the control signals CT11-CT14 to control the detecting circuit 120 and further enables the detecting circuit 120 to conduct the transmission line TL13, which is for transmitting the negative receiving signal RX−, to the ground. Then, as shown in Step S250, the memory controller 130 detects the state of the positive receiving signal RX+ transmitted by the transmission line TL12 and determines whether to generate the abnormal indication signal ID1 according to the detecting result. In addition, as shown in Step S260, when the abnormal indication signal ID1 is generated, the control unit 140 controls the indication lights 151-155 according to the abnormal indication signal ID1.

For example, if the detecting result shows that the state of the positive receiving signal RX+ is abnormal, open or short circuit may have occurred on the RX+ pin of the SATA connector and the related wirings on the main board 101. Accordingly, the memory controller 130 generates the corresponding abnormal indication signal ID1, and the control unit 140 lights the indication light, such as indication light 152, corresponding to the positive receiving signal RX+ according to the abnormal indication signal ID1. However, if the detecting result shows that the state of the positive receiving signal RX+ is normal, the memory controller 130 does not generate the corresponding abnormal indication signal ID1, and consequently the indication light corresponding to the positive receiving signal RX+ is not lighted.

Similarly, given that the transmission lines TL14 and TL15 of the bus 170 are respectively used for transmitting a positive output signal TX+ and a negative output signal TX− of the differential output signal, in the testing of the differential output signal, the testing device 100 first conducts the transmission line TL14, for transmitting the positive output signal TX+, to the ground and then detects the state of the negative output signal TX−. Thereafter, the testing device 100 determines whether to turn on the indication light, e.g. indication light 153, corresponding to the negative output signal TX− according to the detecting result. Following that, the testing device 100 conducts the transmission line TL15, for transmitting the negative output signal TX−, to the ground and detects the state of the positive output signal TX+. Further, the testing device 100 determines whether to turn on the indication light, e.g. indication light 154, corresponding to the positive output signal TX+ according to the detecting result.

In other words, the control unit 140 begins the test on the main board 101 based on the ground signal GN11 (enable signal) and generates a plurality of control signals CT11-CT14 accordingly. In addition, during the test, the detecting circuit 120 sequentially conducts the transmission lines TL12-TL15 of the bus 170 to the ground according to the control signals CT11-CT14. Accordingly, the memory controller 130 sequentially detects the states of the signals transmitted by the transmission lines TL12-TL15 and determines whether to generate the abnormal indication signal ID1 according to the detecting result. Moreover, the control unit 140 controls the indication lights 151-155 to turn on or off according to the abnormal indication signal ID1. Based on the above, the testers can preliminarily determine which pin of the SATA connector and the related wirings both on the main board 101 have problems of open or short circuit according to the indication lights 151-155.

Furthermore, in terms of detailed operation, the detecting circuit 120 includes switches SW11-SW14. Herein, the switches SW11-SW14 respectively correspond to the transmission lines TL12-TL15. Moreover, the switches SW11-SW14 respectively include first ends, electrically connected to the transmission lines TL12-TL15, and second ends, electrically connected to the ground. During the test, the detecting circuit 120 sequentially turns on the switches SW11-SW14 according to the control signals CT11-CT14, so as to sequentially conduct the transmission lines TL12-TL15 to the ground.

It is worth mentioning that, after testing the signals transmitted by the bus 170, the control unit 140 turns off the switches SW11-SW14 in the detecting circuit 120, so as to allow the bus 170 to normally transmit the interface signal IT to the memory controller 130. At the same time, the memory controller 130 accesses the memories 161-162 according to the interface signal IT transmitted by the bus 170. Herein, the memories 161-162 are each a flash memory, for example. That is to say, the testing device 100 is not only used for testing the main board 101 but also serves as a solid state disk.

Besides testing the signals transmitted by the bus 170, the testing device 100 is also used for testing signals transmitted by the power/ground pins of the connector 110, so as to determine if the power/ground pins of the SATA connector and the related wirings in the main board 101 have the problems of open or short circuit.

For example, as shown in FIG. 1, in the first embodiment, the detecting circuit 120 further includes resistors R11-R16. Herein, the resistors R11 and R12 are connected in series to form a resistor string, and the resistor string composed of the resistors R11 and R12 is electrically connected between the power pin 113 of the connector 110 and the ground. Similarly, the resistors R13 and R14 are also connected in series to form a resistor string, and the resistor string composed of the resistors R13 and R14 is electrically connected between the power pin 114 of the connector 110 and the ground. A connection structure of the resistors R15 and R16 can be inferred likewise.

In terms of operation, the power pins 113-115 of the connector 110 are used for receiving the power signals PW12-PW14 from the main board 101. In addition, the resistor string formed of the resistors R11 and R12 divides the power signal PW12 to generate a divided signal DV11. Similar to the above, the resistor string formed of the resistors R13 and R14 generates a divided signal DV12 in response to the power signal PW13. A generation of a divided signal DV13 can be inferred likewise. In other words, the detecting circuit 120 respectively divides the signals from the power pins 113-115 and generates the divided signals DV11-DV13 accordingly.

In addition, the control unit 140 sequentially compares the divided signals DV11-DV13 with a first reference voltage and controls the indication lights 151-155 to turn on or off based on a comparison result. For example, if the comparison result shows that the divided signal DV11 is less than the first reference voltage, it indicates that the corresponding power signal PW12 is abnormal, that is, open or short circuit may have occurred on the power pin of the SATA connector and the related wirings both on the main board 101 and for transmitting the power signal PW12. Accordingly, the control unit 140 turns on one of the indication lights 151-155 that corresponds to the power signal PW12.

Moreover, as shown in FIG. 1, in the first embodiment, the detecting circuit 120 further includes resistors R17-R19. Herein, the resistors R17-R19 respectively include first ends for receiving a power voltage VDD and second ends electrically connected to the ground pins 116-118 of the connector 110 for generating detecting signals DT11-DT13. In terms of operation, the ground pins 116-118 of the connector 110 are used for receiving the ground signals GN12-GN14 from the main board 101. Herein, if the ground signals GN12-GN14 are normal, levels of the detecting signals DT11-DT13 approximate to the ground voltage.

On the other hand, if the ground signals GN12-GN14 are abnormal, the levels of the detecting signals DT11-DT13 may rise up to the power voltage VDD by the resistors R17-R19. Therefore, the control unit 140 compares the detecting signals DT11-DT13 with a second reference voltage to determine if the ground signals GN12-GN14 are abnormal, and thereby controls the indication lights 151-156 to turn on or off based on a comparison result. If the ground signals GN12-GN14 are found abnormal, it indicates that open or short circuit may have occurred on the ground pins of the SATA connector and the related wirings both on the main board 101 and for transmitting the ground signals GN12-GN14.

It is noted that the testing device 100 illustrated in the embodiment of FIG. 1 includes a single connection interface, but the disclosure is not limited thereto. For example, the testing device 100 may be equipped with two connection interfaces, which conform to different protocols. According to the above, the testers can directly use one testing device to respectively test the soldering of the connectors with different standards and the conduction of the related wirings in the main board. In order to make the disclosure more comprehensible for those skilled in the art, a testing device including two connection interfaces is illustrated in detail below. For consistency between the descriptions of the disclosure, elements having identical or similar functions and structures are assigned with the same reference numbers and teens in the embodiments.

Figure 3:
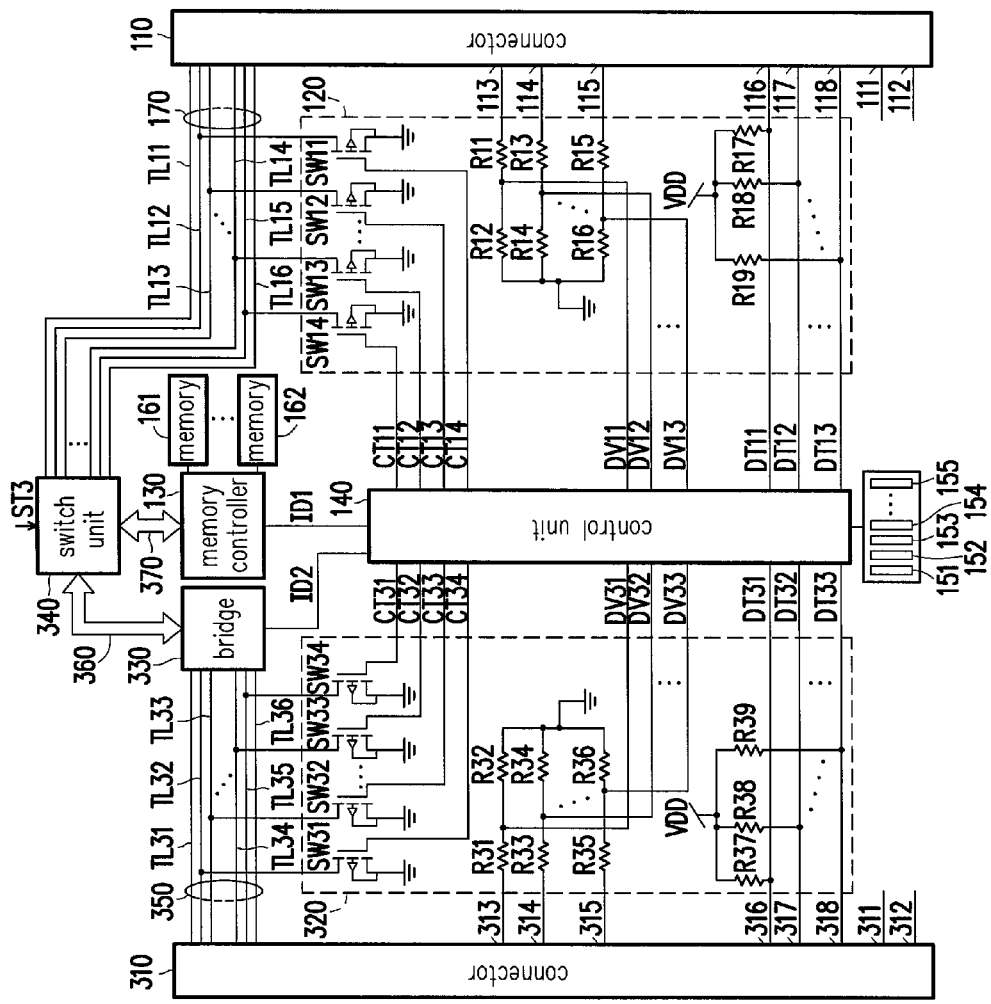
FIG. 3 is a schematic view of a testing device according to the second embodiment of the disclosure.

FIG. 3 is a schematic view of a testing device according to the second embodiment of the disclosure. Referring to FIG. 1 and FIG. 3, a main difference between the first and the second embodiments lies in that: a testing device 300 further includes a connector 310, a detecting circuit 320, a bridge 330, and a switch unit 340, wherein the bus 170 in FIG. 3 is electrically connected to the switch unit 340. Specifically, the connector 310 is electrically connected to an end of a bus 350, and the bridge 330 is electrically connected to the other end of the bus 350, the switch unit 340, and the control unit 140. The bus 350 includes a plurality of transmission lines TL31-TL36. The detecting circuit 320 is electrically connected to the connector 310, the transmission lines TL32-TL35 of the bus 350, and the control unit 140. In addition, the switch unit 340 is electrically connected to the bridge 330 via a bus 360 and electrically connected to the memory controller 130 via a bus 370.

In the second embodiment, the connector 310 conforms to a second protocol, which is Serial Attached SCSI (SAS) protocol, for example. In other words, the connector 310 is a SAS connector, for example. Therefore, in the second embodiment, the testing device 300 is electrically connected to the SAS connector or SATA connector in the main board via the connector 310 or the connector 110, so as to test the open circuit or short circuit of the SAS connector, the SATA connector and the related wirings on the main board.

In terms of operation, when the testing device 300 is electrically connected to the main board via the connector 110, the testing device 300 performs corresponding operations for testing through the detecting circuit 120, the memory controller 130, the control unit 140, and the indication lights 151-155; and the aforesaid operations are similar to the operations in the embodiment of FIG. 1. A main difference is that: the bus 170 of FIG. 3 is electrically connected to the memory controller 130 via the switch unit 340. Therefore, in the second embodiment shown in FIG. 3, when the control unit 140 receives the ground signal (i.e. enable signal) from the ground pin 112 of the connector 110, the control unit 140 further switches a level of a switch signal ST3 to a first level (logic 1, for example). Thereby, the switch unit 340 conducts the bus 370 to the bus 170 according to the switch signal ST3 with the first level. Accordingly, the interface signal transmitted by the bus 170 is transmitted to the bus 370, so as to enable the memory controller 130 to access the memories 161-162 according to the interface signal from the bus 370.

On the other hand, when the testing device 300 is electrically connected to the main board via the connector 310, the testing device 300 performs operations for testing through the detecting circuit 320, the bridge 330, the control unit 140, and the indication lights 151-155. At the same time, the testing device 300 uses the power signal from the power pin 311 of the connector 310 to generate an operating voltage required by the internal elements thereof. The testing device 300 regards the ground signal from the ground pin 312 of the connector 310 as an enable signal and begins testing the main board.

When testing the main board, the control unit 140 generates a plurality of control signals CT31-CT34 according to the ground signal (i.e. enable signal) from the ground pin 312. Moreover, during the test, the detecting circuit 320 sequentially turns on the switches SW31-SW34 according to the control signals CT11-CT14, so as to sequentially conduct the transmission lines TL32-TL35 to the ground. Accordingly, the bridge 330 sequentially detects the states of the signals transmitted by the transmission lines TL32-TL35 and determines whether to generate an abnormal indication signal ID2 according to the detecting result. Correspondingly, the control unit 140 controls the indication lights 151-155 according to the abnormal indication signal ID2. Based on the above, the testers can preliminarily determine if the problem of open or short circuit occurs on the SAS connector and the related wirings of the main board.

For example, the transmission lines TL32-TL35 of the bus 170 are used for transmitting the differential receiving signal and the differential output signal in the interface signal from the main board. Hence, when the bridge 330 determines that the signals transmitted by the transmission lines TL32-TL35 are abnormal, it indicates that open or short circuit may have occurred on the pin of the SAS connector and the related wirings both on the main board and for transmitting the differential receiving signal and the differential output signal. After the signals transmitted by the bus 350 is detected, the control unit 140 turns off the switches SW31-SW34 in the detecting circuit 320, so as to allow the bus 350 to normally transmit the interface signal from the main board to the bridge 330.

It is noted that, when the testing device 300 is electrically connected to the main board via the connector 310, the control unit 140 further switches the level of the switch signal ST3 to a second level (logic 0, for example) according to the ground signal (i.e. enable signal) from the ground pin 312. Thereby, the switch unit 340 conducts the bus 370 to the bus 360 according to the switch signal ST3 with the second level.

In the second embodiment, the bus 350 is a SAS bus, and the bus 360 and the bus 370 are both SATA buses, for example. In order to transmit the interface signal from the bus 350 to the buses 360 and 370, the bridge 330 converts a format of the interface signal transmitted by the bus 350. Accordingly, when the testing device 300 is electrically connected to the main board via the connector 310, the memory controller 130 can still access the memories 161-162 according to the interface signal from the bus 370.

Additionally, the testing device 300 is also used for testing the signals transmitted by the power/ground pins of the connector 310, so as to determine if the power/ground pins of the SAS connector and the related wirings on the main board have the problem of open or short circuit. For instance, the detecting circuit 320 uses the resistors R31-R36 to respectively divide the signals from the power pins 313-315 and generate the divided signals DV31-DV33 accordingly. In addition, the control unit 140 sequentially compares the divided signals DV31-DV33 with the first reference voltage and controls the indication lights 151-155 based on the comparison result. If the comparison result shows that the divided signal DV31 is less than the first reference voltage, it indicates that the signal from the power pin 313 is abnormal, that is, open or short circuit may have occurred on the power pin of the SAS connector and the related wirings on the main board. Accordingly, the control unit 140 turns on the corresponding indication light.

Further, the testing device 300 uses the resistors R37-R39 to detect the signals from the ground pins 316-318 and generates detecting signals DT31-DT33 accordingly. The control unit 140 then compares the detecting signals DT31-DT33 with the second reference voltage to determine if the signals transmitted by the ground pins 316-318 are abnormal, and controls the indication lights 151-156 based on the comparison result. If the signals transmitted by the ground pins 316-318 are found abnormal, it indicates that open or short circuit may have occurred on the ground pins of the SAS connector and the related wirings on the main board. Accordingly, the control unit 140 turns on the corresponding indication light. The detailed structure of the detecting circuit 320 of the embodiment in FIG. 3 is similar to that of the detecting circuit 120 of the embodiment in FIG. 1, and thus detailed descriptions are not repeated hereinafter.

In conclusion of the above, the testing device of the disclosure is connected to a main board via a connector and tests the signals from the connector to determine if signals of the main board are abnormal. If the signals of the main board are determined abnormal, it indicates that open or short circuit may have occurred on a connector and the related wirings both on the main board and for transmitting the signals. Accordingly, the soldering of the connector and the conduction of the related wirings on the main board can be tested. The testing device of the disclosure is adapted to be electrically connected to the connector on the main board and packaged in a DIP, such as SATA connector, SAS connector, etc., and therefore, the testing device of the disclosure can be used to test the DIP devices on the main board. Moreover, the testing device of the disclosure is used as a solid state disk. That is, the testing device of the disclosure not only tests the interface signals of the hard disk but also helps reduce the production cost of the system.

It will be apparent to those skilled in the art that various modifications and variations can be made to the disclosed embodiments without departing from the scope or spirit of the disclosure. In view of the foregoing, it is intended that the disclosure covers modifications and variations of this disclosure provided that they fall within the scope of the following claims and their equivalents.

What is claimed is:

1. A testing device, comprising:
   a first connector, electrically connected to a first bus;
   a first detecting circuit, electrically connected to a plurality of first transmission lines in the first bus and sequentially conducting the first transmission lines to a ground according to a plurality of first control signals;
   a memory controller, detecting states of signals transmitted by the first transmission lines and determining whether to generate a first abnormal indication signal according to a detecting result; and
   a control unit, electrically connected to the first detecting circuit and the memory controller and generating the first control signals according to a first enable signal from the first connector, wherein the control unit controls a plurality of indication lights according to the first abnormal indication signal.

2. The testing device according to claim 1, further comprising:
   a plurality of memories, electrically connected to the memory controller, wherein the memory controller accesses the memories according to an interface signal transmitted by the first bus.

3. The testing device according to claim 1, wherein the first detecting circuit comprises:
   a plurality of first switches, respectively corresponding to the first transmission lines, and comprising first ends electrically connected to the first transmission lines and second ends electrically connected to the ground,
   wherein the first detecting circuit sequentially turns on the first switches by the first control signals.

4. The testing device according to claim 1, wherein the first connector comprises a plurality of first power pins, the first detecting circuit respectively divides signals from the first power pins and generates a plurality of first divided signals accordingly, and the control unit compares the first divided signals with a first reference voltage and controls the indication lights according to a comparison result.

5. The testing device according to claim 4, wherein the first detecting circuit further comprises:
   a plurality of first resistor strings, electrically connected between the first power pins and the ground and generating the first divided signals in response to the signals from the first power pins.

6. The testing device according to claim 1, wherein the first connector further comprises a plurality of first ground pins, the first detecting circuit detects signals from the first ground pins and generates a plurality of first detecting signals accordingly, and the control unit compares the first detecting signals with a second reference voltage and controls the indication lights according to a comparison result.

7. The testing device according to claim 6, wherein the first detecting circuit further comprises:
   a plurality of first resistors, comprising first ends receiving a power voltage and second ends electrically connected to the first ground pins and generating the first detecting signals.

8. The testing device according to claim 1, further comprising:
   a second connector, electrically connected to a second bus, and the control unit generating a plurality of second control signals according to a second enable signal from the second connector;
   a second detecting circuit, electrically connected to a plurality of second transmission lines in the second bus and sequentially conducting the second transmission lines to the ground according to the second control signals; and
   a bridge, electrically connected to the second bus, and the bridge detecting states of signals transmitted by the second transmission lines and determining whether to generate a second abnormal indication signal according to a detecting result, wherein the control unit controls the indication lights according to the second abnormal indication signal.

9. The testing device according to claim 8, further comprising:
   a switch unit, electrically connected to the first bus and electrically connected to the bridge and the memory controller via a third bus and a fourth bus, wherein the control unit adjusts a level of a switch signal according to the first enable signal or the second enable signal, and the switch unit conducts one of the first bus and the third bus to the fourth bus according to the level of the switch signal, so as to enable the memory controller to access a plurality of memories according to an interface signal from the fourth bus.

10. The testing device according to claim 9, wherein the first connector, the first bus, the third bus, and the fourth bus conform to a first protocol; the second connector and the second bus conform to a second protocol; and the bridge converts a format of an interface signal transmitted by the second bus.

11. The testing device according to claim 8, wherein the second detecting circuit comprises:
    a plurality of second switches, respectively corresponding to the second transmission lines and comprising first ends electrically connected to the second transmission lines and second ends electrically connected to the ground,
    wherein the second detecting circuit sequentially turns on the second switches by the second control signals.

12. The testing device according to claim 8, wherein the second connector comprises a plurality of second power pins, the second detecting circuit respectively divides signals from the second power pins and generates a plurality of second divided signals accordingly, and the control unit compares the second divided signals with a first reference voltage and controls the indication lights according to a comparison result.

13. The testing device according to claim 12, wherein the second detecting circuit further comprises:
    a plurality of second resistor strings, electrically connected between the second power pins and the ground and generating the second divided signals in response to the signals from the second power pins.

14. The testing device according to claim 8, wherein the second connector further comprises a plurality of second ground pins, the second detecting circuit detects signals from the second ground pins and generates a plurality of second detecting signals accordingly, and the control unit compares the second detecting signals with a second reference voltage and controls the indication lights according to a comparison result.

15. The testing device according to claim 14, wherein the second detecting circuit further comprises:
    a plurality of second resistors, comprising first ends receiving a power voltage and second ends electrically connected to the second ground pins and generating the second detecting signals.

* * * * *